US010502769B2

(12) United States Patent
Loh et al.

(10) Patent No.: US 10,502,769 B2
(45) Date of Patent: Dec. 10, 2019

(54) DIGITAL VOLTMETER

(71) Applicant: Invecas, Inc., Santa Clara, CA (US)

(72) Inventors: William Loh, Fremont, CA (US); Venkata N. S. N. Rao, Fremont, CA (US); Prasad Chalasani, San Jose, CA (US)

(*) Notice: Subject to any disclaimer, the term of this patent is extended or adjusted under 35 U.S.C. 154(b) by 317 days.

(21) Appl. No.: 15/698,289

(22) Filed: Sep. 7, 2017

(65) Prior Publication Data

US 2019/0072589 A1   Mar. 7, 2019

(51) Int. Cl.
| | | |
|---|---|---|
| *G01R 19/25* | (2006.01) | |
| *G01R 19/255* | (2006.01) | |
| *G01R 13/02* | (2006.01) | |
| *G01R 19/155* | (2006.01) | |
| *G01R 15/12* | (2006.01) | |

(52) U.S. Cl.
CPC ..... *G01R 19/2503* (2013.01); *G01R 13/0272* (2013.01); *G01R 19/155* (2013.01); *G01R 19/255* (2013.01); *G01R 15/125* (2013.01)

(58) Field of Classification Search
CPC .............. G01R 19/2503; G01R 19/255; G01R 13/0272; G01R 19/155; G01R 15/125; G01R 19/16576; G01R 31/2856; H03M 1/56

See application file for complete search history.

(56) References Cited

U.S. PATENT DOCUMENTS

| | | | |
|---|---|---|---|
| 10,015,422 B1* | 7/2018 | Kim | H03M 1/14 |
| 2015/0042859 A1* | 2/2015 | Lee | H04N 5/3575 |
| | | | 348/311 |
| 2015/0194973 A1* | 7/2015 | Furuta | H03M 1/002 |
| | | | 348/308 |
| 2017/0339359 A1* | 11/2017 | Kim | H04N 5/378 |

FOREIGN PATENT DOCUMENTS

EP    3439182 A1 *  2/2019  .......... H03M 1/0685

* cited by examiner

*Primary Examiner* — Daniel R Miller
(74) *Attorney, Agent, or Firm* — Venture Pacific Law, PC

(57) ABSTRACT

A digital voltmeter, where a number of clock pulses for a first ramp voltage to reach an input voltage is determined. Next, a number of clock pulses for a second ramp voltage to reach the input voltage is determined. One of the first and the second ramp voltages having a least number of clock pulses to reach the input voltage is determined. A determination is made for a number of clock pulses for the determined one of the first and the second ramp voltages to reach a reference voltage. A digital code is generated for the input voltage based on the determined number of clock pulses for reaching the reference voltage and the determined least number of clock pulses for reaching the input voltage.

20 Claims, 9 Drawing Sheets

DIGITAL VOLTMETER

FIELD OF INVENTION

This present disclosure generally relates to circuits, methods, and systems for analog to digital conversion, and, in particular, to a digital voltmeter for on-chip testing.

BACKGROUND

Testing the operation of an integrated circuit and determining that it is operating as desired has become increasingly difficult as integrated circuit complexity has increased. Adequate testing frequently requires the testing of internal circuits that are not directly accessible from the device's terminals. One technique known as built-in self test ("BIST"), is useful for faster, at-speed testing of circuits with large, regular structures such as in integrated circuit memories. BIST uses a small controller circuit on the chip to carry out tests on command and to provide the results to an external agent. BIST enables faster testing of large on-chip memory structures at the expense of additional area and power costs for the on-chip test logic. The architecture for memory BIST logic is designed to enable at-speed testing of the on-chip memories while making acceptable tradeoffs between power and chip area.

A digital voltmeter ("DVM") is an integral component of an on-chip BIST block for measuring voltages of a low input resistance source with rail-to-rail range. The DVM can be implemented by an analog-to-digital converter ("ADC") circuit. The DVM can be part of a larger block of an IC to perform intermittent and/or continuous voltage monitoring of certain nodes, e.g. bias, vtune, etc., in order to ensure that proper bias conditions are met. Another usage for the DVM is that it can be used as a sampler for low-speed (e.g., a few MHz) signals. The DVM can also be used by the BIST to test one or more nodes of the IC depending on the design of the IC.

However, a DVM typically uses an operational amplifier for such conversion, which is untenable for an on-chip BIST since operational amplifiers require a large amount of chip area. Additionally, a DVM can suffer from mismatch and gain errors with no means for calibration of the DVM. Therefore, due to these drawbacks, it is desirable to provide new circuits, methods, and systems for a DVM.

DESCRIPTION OF THE DRAWINGS

The foregoing and other objects, aspects, and advantages of the present disclosure can be better understood from the following detailed description of the preferred embodiments of the present disclosure when taken in conjunction with the accompanying drawings in which.

DETAILED DESCRIPTION OF THE PREFERRED EMBODIMENTS

In the following detailed description of the embodiments, reference is made to the accompanying drawings, which form a part hereof, and in which is shown by way of illustration of specific embodiments in which the present disclosure may be practiced.

Figure 1:
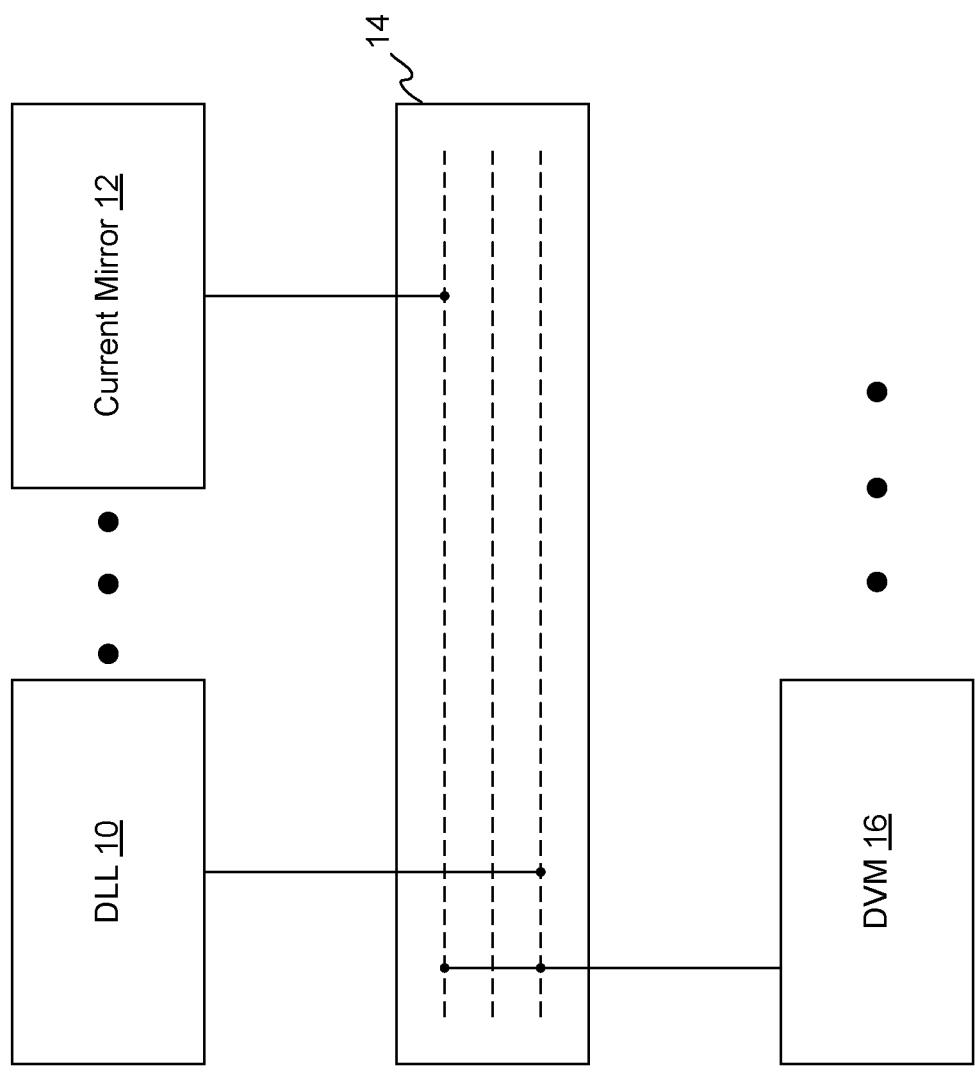
FIG. 1 illustrates a block diagram of an integrated circuit having a matrix, a digital voltmeter ("DVM") of the present disclosure, and other circuit blocks.

FIG. 1 illustrates a block diagram of an integrated circuit having a matrix, a digital voltmeter ("DVM") of the present disclosure, and other circuit blocks. An IC can comprise various circuit blocks including a delay locked loop ("DLL") 10, a current mirror 12, a digital voltmeter 16, and a matrix 14 for connecting nodes to be sensed from the other circuit blocks to the DVM 16. To aid in the understanding of the present disclosure, only a small subset of circuit blocks of an IC is shown. However, it's understood that additional circuit blocks of the IC can be coupled to the DVM 16 for sensing a voltage at a node. Furthermore, it's also understood that the IC can have multiple DVMs for coupling to various nodes of the IC for sensing.

The matrix 14 is programmable to allow for connecting one of the nodes from the DLL 10 and the current mirror 12 to the DVM 16 for voltage sensing. The DVM can sense the analog signal at the node under test and provide a digital code or signal indicative of the voltage value at that node under test. The testing can be performed any number of times for monitoring and/or testing at the node. Additionally, various nodes can be connected to the DVM 16 by programming the matrix 14 to connect the selected node to be tested with the DVM 16.

Figure 2:
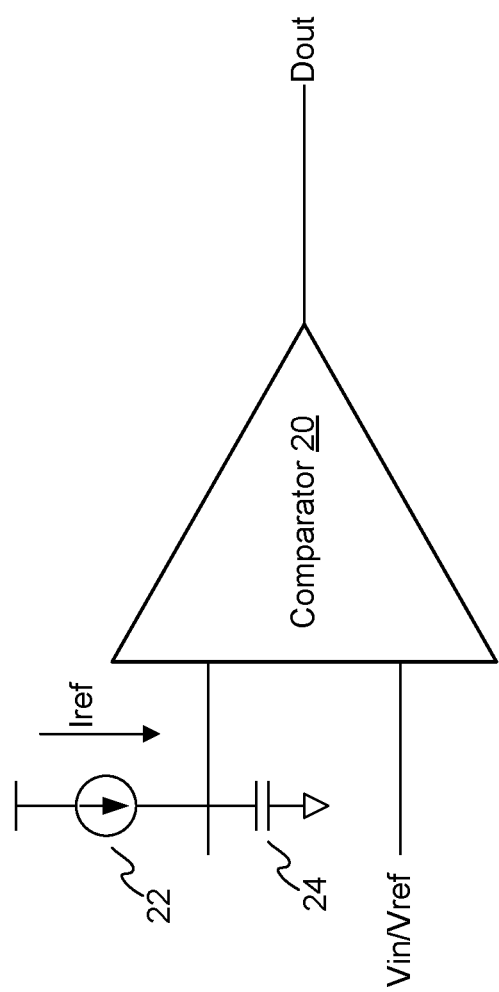
FIG. 2 illustrates a diagram of a comparator for use by a DVM.

FIG. 2 illustrates a diagram of a comparator for use by a DVM. A DVM can be implemented by an integrating analog-to-digital converter ("ADC"), also known as a time-to-digital converter. The DVM comprises a comparator 20, a current source 22, and a capacitor 24. The current source 22 and the capacitor 24 are serially connected, where the serial connection is coupled to an input of the comparator 20. Another input of the comparator 20 is coupled to an input voltage (or a reference voltage depending on which voltage is to be sensed). The comparator 20 compares a ramp voltage generated by the current source 22 and the capacitor 24 to the input voltage (or the reference voltage). When the ramp voltage from the serial connection between the current source 22 and the capacitor 24 reaches the input voltage (or the reference voltage, whichever voltage is applied to the input of the comparator 20), an output Dout of the comparator 20 provides a signal of such event.

In operation, a DVM counts a number of pulses between start event and a stop event during the ramping voltage. The number of pulses counted can be converted to a digital voltage code. The start event can be initiated when a current Iref from the current source 22 begins to charge the capacitor 24. A stop event can be when the voltage ramp Vramp reaches the input voltage Vin or the reference voltage Vref. The pulse count for the number of pulses during this period can be translated to a digital code to represent the analog input voltage Vin (or the analog reference voltage Vref). The pulse count and translation can be performed by a digital core ("dcore") of the IC, not shown. The digital core is well known in the art and can be implemented using RTL (register transfer logic), which can be synthesized into a layout. For this reason, various implementations for the digital core can be used in conjunction with the present disclosure.

First, a pulse count can be found from when the voltage ramp starts ramping and until the voltage ramp reaches the input voltage. Using this pulse count alone may lead to mismatch and gain errors. Thus, in addition to tracking the input voltage Vin, a reference voltage (e.g., a fractional amount of a rail voltage VDD for the DVM or other voltage amount independent of the input voltage) can be applied to the comparator 20 and pulse counting can be performed by reinitializing the ramp voltage for ramping to obtain a pulse count for the reference voltage. By obtaining the pulse count for the reference voltage Vref, a pulse count ratio of pulse_count_vin and pulse_count_vref can be determined and used to represent Vin as a fraction of Vref. For example, if the pulse count ratio is 20/25, then it can be inferred that Vin is 80% of Vref. This relative pulse count scheme can minimize errors associated with using an absolute pulse count.

The reference voltage Vref can be as simple as VDD and ground, or a ratio in between by using large resistor dividers that are insensitive to variations (e.g., PVT variations). Also, a decision to ramp-up or ramp-down is not needed a priori since both can be applied to the input voltage to determine which one provides for a shorter pulse count. From there, the ramping direction that provides for a shorter pulse count can be applied as the ramping direction for determining a pulse count for the reference voltage.

Figure 3:
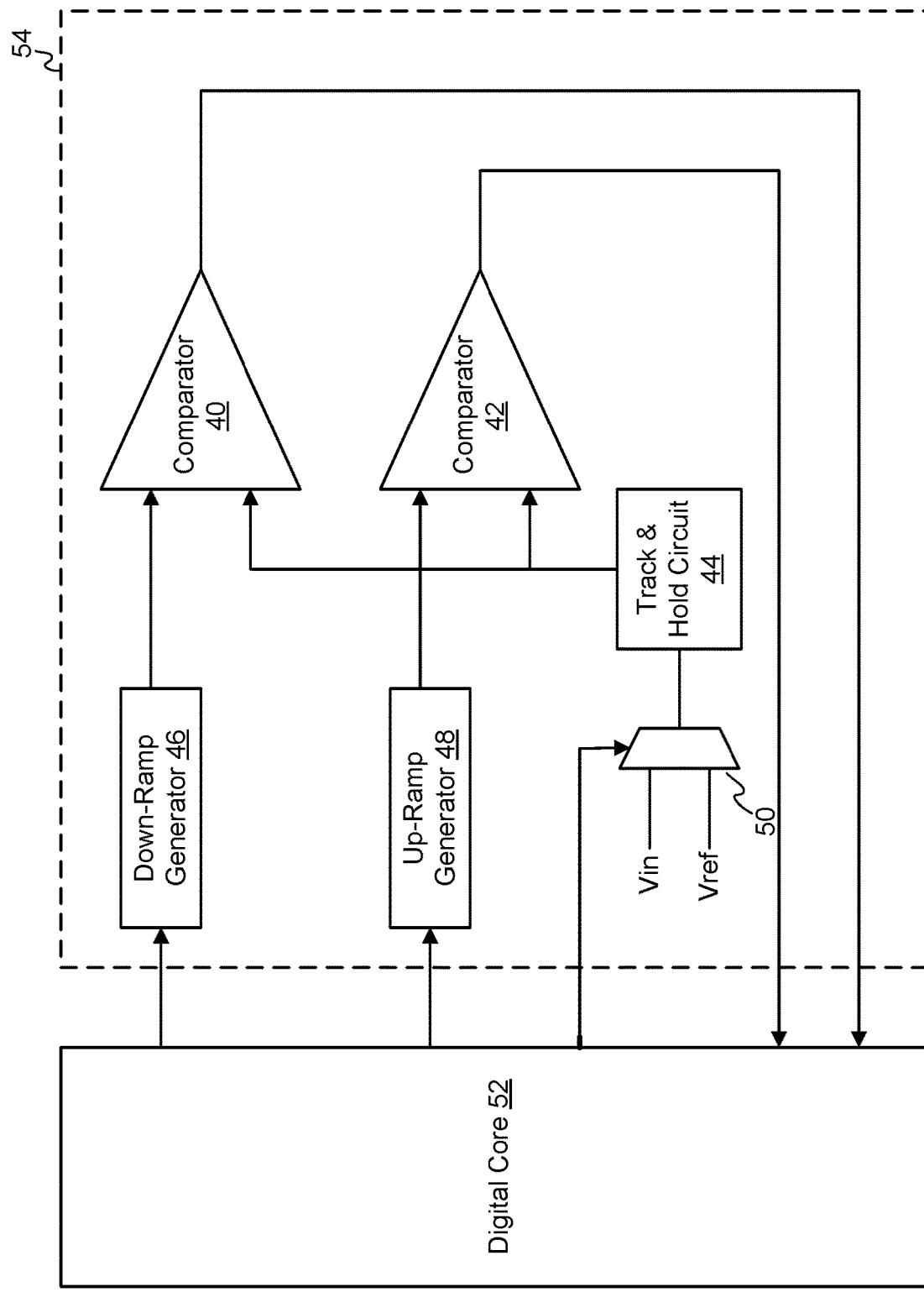
FIG. 3 illustrates a block diagram of a DVM of the present disclosure.

FIG. 3 illustrates a block diagram of a DVM of the present disclosure. In an embodiment, a DVM of the present disclosure comprises comparators 40 and 42, track and hold circuit 44, a down-ramp generator 46, an up-ramp generator 48, a multiplexer 50 for selecting between an input voltage and a reference voltage, and a digital core 52. An output of the multiplexer 50 is coupled to an input of the track and hold circuit 44. An output of the down-ramp generator 46 and an output of the track and hold circuit 44 are each coupled to separate inputs of the comparator 40. Additionally, an output of the up-ramp generator 48 and the output of the track and hold circuit 44 are each coupled to separate inputs of the comparator 42. An output of the comparator 40 indicates when the downward ramping voltage signal reaches the selected voltage and an output of the comparator 42 indicates when the upward ramping voltage signal reaches the selected voltage.

The digital core 52 can comprise a variety of logic for counting pulses, triggering start and stop events, and controlling blocks within the DVM. The digital core 52 can be on-chip or off-chip depending on the implementation of the DVM. For instance, if the digital core 52 is off-chip, then on-chip components 54 can be coupled to the off-chip digital core 52 through input/output ("I/O") pins (not shown). If the digital core 52 is on-chip, then the components 54 can be coupled to the digital core 52 rather than through any I/O pins.

In an embodiment, the digital core 52 can comprise a counter for counting clock pulses based on the outputs of the down-ramp generator 46 and the up-ramp generator 48, a logic for operating the down-ramp generator 46, the up-ramp generator 48, and the multiplexer 50, and registers for storing pulse counts, ramp direction information, and other information for the DVM. The logic can be coupled to control inputs of the down-ramp generator 46, the up-ramp generator 48, and the multiplexer 50, where the input voltage Vin and the reference voltage Vref are coupled to inputs of the multiplexer 50 and where the outputs of the comparator 40 and the comparator 42 are coupled to the digital core 52.

The multiplexer 50 can be controlled by the digital core 52 and has two inputs, one input for the input voltage Vin and another input for the reference voltage Vref. The digital core 52 can select one of the input voltage Vin and the reference voltage Vref for counting clock pulses during ramping of a ramp voltage. It is apparent from the present disclosure that the multiplexer 50 can provide for a number of inputs for pulse counting for each input to further verify one of the pulse count ratios. To aid in the understanding of the present disclosure, other embodiments in which more than two pulse counts are determined have been omitted to emphasize the underlying concept of the present disclosure. However, it is understood that the present disclosure is meant to cover such other embodiments as well.

The output of the multiplexer 50 (i.e., the selected one of the voltages) is coupled to the track and hold circuit 44. The track and hold circuit 44 can be used to hold the selected voltage for input to the comparators 40 and 42. A storage capacitor with an enabling switch can be used to implement such track and hold circuit 44, where the storage capacitor can sample an analog signal at a sampling node ("snode"). The snode can be discharged to ground via the switch. Afterwards, the charging can begin via a constant current to ramp the voltage at the snode. It is appreciated that other well-known circuitry can be used to track and hold the selected voltage for input to one or more components. The present disclosure is meant to include such other known circuitry and is not meant to be limited to any particular implementation of the track and hold circuit described herein.

Once the track and hold circuit 44 provides a selected voltage to the comparator 40 and the comparator 42, ramping voltages and pulse counting can begin. Either the down-ramp generator 46 can generate a downward ramping voltage from a high voltage, e.g., the rail voltage Vdd, or the up-ramp generator 48 can generate an upward ramping voltage from a low voltage, e.g., ground. The up-ramp generator 48 and down-ramp generator 46 can be implemented by current sources or other equivalent circuits. It is appreciated that pulse counting can be started for either an upward ramping voltage or a downward ramping voltage first, and then performed for the other ramping voltage.

Thus, the track and hold circuit 44 can provide a stable voltage at the positive or the sampling node of the comparators. Connecting the input of the comparator from an outside analog voltage directly is not desirable due to a back-coupling noise. Instead, the track and hold circuit 44 can be used within the DVM. In this initial phase, the input voltage is connected to the snode by turning on a pass gate to charge up the capacitor till it reaches a steady state. This can be referred to as the tracking mode. Then, the snode can be disconnected from the external input to keep its capacitor charged and to preserve the input voltage. This can be referred to as the hold mode.

After the track and hold are completed, a ground clamp can be released from the other negative or charging node ("cnode") of the comparator. Once a start signal is initialized, a current source will start charging that nodal capacitor up from either ground or from a supply voltage. Once the cnode voltage reaches the value of the snode, the comparator can switch from a low output value to a high output value (or vice versa to indicate such event). The time duration of this ramp will be the digital representation of the analog input voltage. The internal reference Vref can also be sampled and pulse counted. The digital core can then compute the ratio of those two pulse counts to get a pulse count ratio.

In one example, pulse counting can be started for the input voltage Vin by initiating the down-ramp generator 46 to generate a downward ramping voltage from the high voltage, Vdd. The pulse count can be started by the digital core 52 when the down-ramp generator 46 initiates the downward ramping voltage. The downward ramping voltage is applied to an input of the comparator 40. When the downward ramping voltage reaches the input voltage Vin (or within a predetermined range of Vin based on the comparator design) causing the comparator 40 to switch output values to indicate this event, the digital core 52 can use this indication to stop the pulse count. The pulse count can be performed by counting a number of high outputs of a clock signal during the span of time between when the pulse counting begins and when the pulse counting stops.

Next, pulse counting can be started for the input voltage Vin by initiating the up-ramp generator 48 to generate an upward ramping voltage from a low voltage, e.g., ground. The pulse count can be started by the digital core 52 when the up-ramp generator 48 initiates the upward ramping voltage. The upward ramping voltage is applied to an input of the comparator 42. When the upward ramping voltage reaches the input voltage Vin (or within a predetermined range of Vin) causing the comparator 42 to switch output values to indicate this event, the digital core 52 can use this indication to stop the pulse count. The pulse count can be performed by counting a number of high outputs of a clock signal during the span of time between when the pulse counting begins and when the pulse counting stops.

Once the number of pulse counts during downward ramping and the number of pulse counts during upward ramping are determined by the digital core 52, the least number of the two are determined so that the corresponding ramp voltage for that number of pulse count can be found to have the shortest amount of time to reach the input voltage. As an optimization, the ramp direction leading to this least number of pulse counts can be stored in the digital core 52 (or elsewhere) for future use along with the least number of pulse counts for the input voltage. Since this stored ramp voltage can be used to get the shortest amount of time for reaching the input voltage, the stored ramp voltage can be used for determining the number of pulses for the reference voltage.

Next, a pulse count for the reference voltage can be determined using the stored ramping voltage direction information. The DVM can be reset such that the components reset to a default state, e.g., the track and hold circuit 44 can release the input voltage, the comparators are reset for new comparisons, etc. Once reset has occurred, the multiplexer 50 can be controlled by the digital core 52 to switch its output from the input voltage to the reference voltage Vref. The track and hold circuit 44 receives that reference voltage from the multiplexer 50. The track and hold circuit 44 further outputs the selected reference voltage to the comparators 40 and 42.

The stored ramping voltage direction is used to determine which one of the generators 46 and 48 to use for ramping. If the stored ramping voltage direction is downward, then the down-ramp generator is initiated from the high voltage, where the ramp voltage is applied to the input of the comparator 40. Once the ramping is initiated, the pulse count can be started. Once the downward ramping voltage reaches the reference voltage Vref (or within a predetermined range of Vref based on the comparator design), causing the comparator 40 to switch output values to indicate this event, the digital core 52 can use this indication to stop the pulse count. The pulse count can be performed by counting a number of high outputs of the clock signal during the span of time between when the pulse counting begins and when the pulse counting stops.

Alternatively, if the stored ramping voltage direction is upward, then the up-ramp generator 48 is initiated from the low voltage (e.g., ground), where the ramp voltage is applied to the input of the comparator 42. Once the ramping is initiated, the pulse count can be started. Once the upward ramping voltage reaches the reference voltage Vref (or within a predetermined range of Vref based on the comparator design), causing the comparator 42 to switch output values to indicate this event, the digital core 52 can use this indication to stop the pulse count. The pulse count can be performed by counting a number of high outputs of the clock signal during the span of time between when the pulse counting begins and when the pulse counting stops.

Now that the number of pulse counts for a ramping direction are known for the input voltage Vin and the reference voltage Vref, a ratio value can be determined such that Vref/Vin=(# of pulses during ramping to Vref)/(# of pulses during ramping to Vin). Equation [1] Since pulse counts are only integers, the reference voltage and the pulse counts can be used to deduce the input voltage Vin via Equation [1]. The dcore can convert this deduction to a digital code.

It is appreciated that a DVM of the present disclosure can be incorporated in a BIST device of an IC. For example, a BIST can comprise the following: a digital voltmeter and a matrix for coupling one or more nodes of the IC to be sensed by the digital voltmeter for testing, where the digital voltmeter comprises: a multiplexer for selecting between an input voltage and a reference voltage; a down-ramp generator for generating a downward ramping voltage signal; an up-ramp generator for generating an upward ramping voltage signal; a track and hold circuit for providing a selected voltage from the multiplexer to the down-ramp generator and the up-ramp generator; a first comparator; and a second comparator. An output of the multiplexer can be coupled to an input of the track and hold circuit. An output of the down-ramp generator and an output of the track and hold circuit can be coupled to inputs of the down-ramp comparator. Furthermore, an output of the up-ramp generator and the output of the track and hold circuit can be coupled to inputs of the up-ramp comparator. An output of the first comparator indicates when the downward ramping voltage signal reaches the selected voltage. Also, an output of the up-ramp generator indicates when the upward ramping voltage signal reaches the selected voltage. In a further embodiment, the down-ramp generator and the up-ramp generator can be implemented by current sources. One of the comparators can be an N-type metal-oxide-semiconductor ("NMOS")-based comparator and the other comparator can be a P-type metal-oxide-semiconductor ("PMOS")-based comparator. Also, the track and hold circuit can comprises a capacitor for storing the selected voltage and a switch turning on the storage mode or releasing the voltage.

It can be appreciated that components of the DVM of the present disclosure can be either entirely on-chip, entirely off-chip, or a hybrid between the two. The present disclosure is meant to include all such variations and not meant to be limited to the present example.

In yet further embodiment, the digital core can be on-chip, wherein the digital core comprises a counter for counting clock pulses based on the outputs of the down-ramp generator and the up-ramp generator, a logic for operating the down-ramp generator, the up-ramp generator, and the multiplexer, and registers for storing counted clock pulses. The logic can be coupled to control inputs of the down-ramp generator, the up-ramp generator, and the multiplexer, where the input voltage and the reference voltage are coupled to inputs of the multiplexer, and where the outputs of the down-ramp generator and the up-ramp generator are coupled to the digital core.

If the digital core is off-chip, the digital core can be connected to the on-chip components through I/O pins. The I/O pins for the DVM can be used to couple the external digital core circuitry to control the down-ramp generator, the up-ramp generator, the multiplexer, and other components of the DVM.

In another embodiment, the comparator 40 can be an NMOS-based comparator and the comparator 42 can be a PMOS-based comparator. The capability of PMOS field effect transistors ("FET") and NMOSFET can be taken advantage of by switching on one at a time for specific ramp directions in the current sourcing/sinking to charge/discharge the storage capacitor. Specifically, an up-ramp can be handled by NMOSFET and a down-ramp can be handled by a PMOSFET. This can reduce or eliminate an issue of current source going into triode mode, which lowers the output resistance to degrade linearity. Thus, only a linear part of the PMOSFET and NMOSFET are used in operating current-voltage ("IV") curves. Furthermore, both up-ramp and down-ramp can be executed and the one with the least pulse count, i.e., the ramp that finishes first can be used for the ratio calculation down the line.

Figure 4:
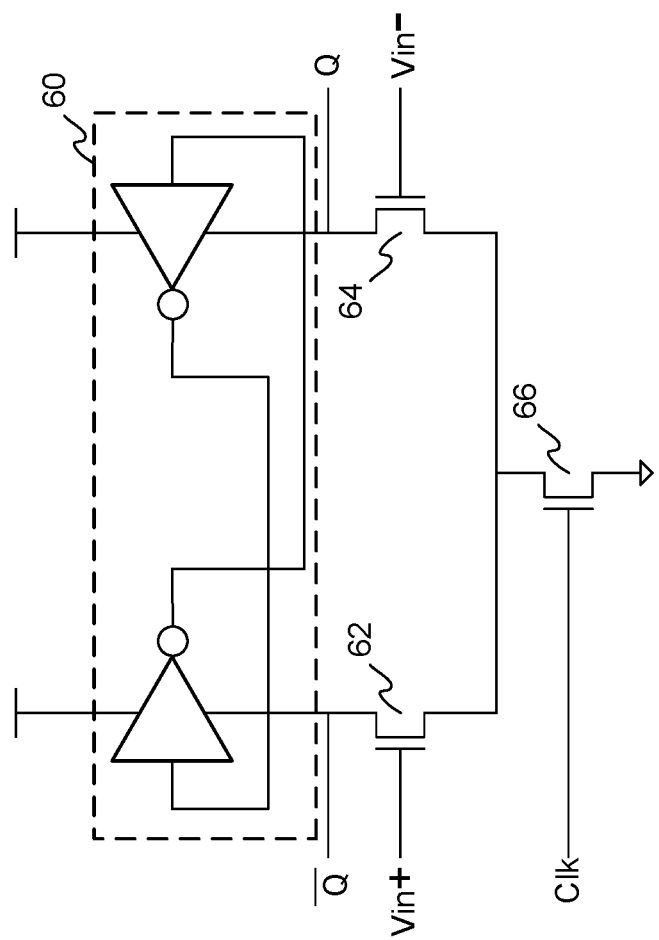
FIG. 4 illustrates an N-type metal-oxide-semiconductor ("NMOS")-based comparator of a DVM of the present disclosure.

FIG. 4 illustrates an NMOS-based comparator of a DVM of the present disclosure. An NMOS-based comparator can be used for comparing a selected voltage and a downward ramping voltage. The NMOS-based comparator can comprise a storage element 60 and NMOS transistors 62-66. The storage element 60 can comprise two cross-coupled inverters. The transistor 62 and the storage element can be coupled together at an inverse output $\overline{Q}$. The transistor 64 and the storage element 60 can be coupled together at an output Q. The transistor 66 is coupled across the transistors 62 and 64 and ground. The gate of the transistor 62 can be an input Vin+ for the comparator. The gate of the transistor 64 can be an input Vin− for the comparator. The gate of the transistor 66 can be coupled to a clock signal CLK.

It is appreciated that other comparator designs can be used in conjunction with the present disclosure. The present figure is only meant to aid in the understanding of the present disclosure and is not meant to limit the present disclosure in any manner.

Figure 5:
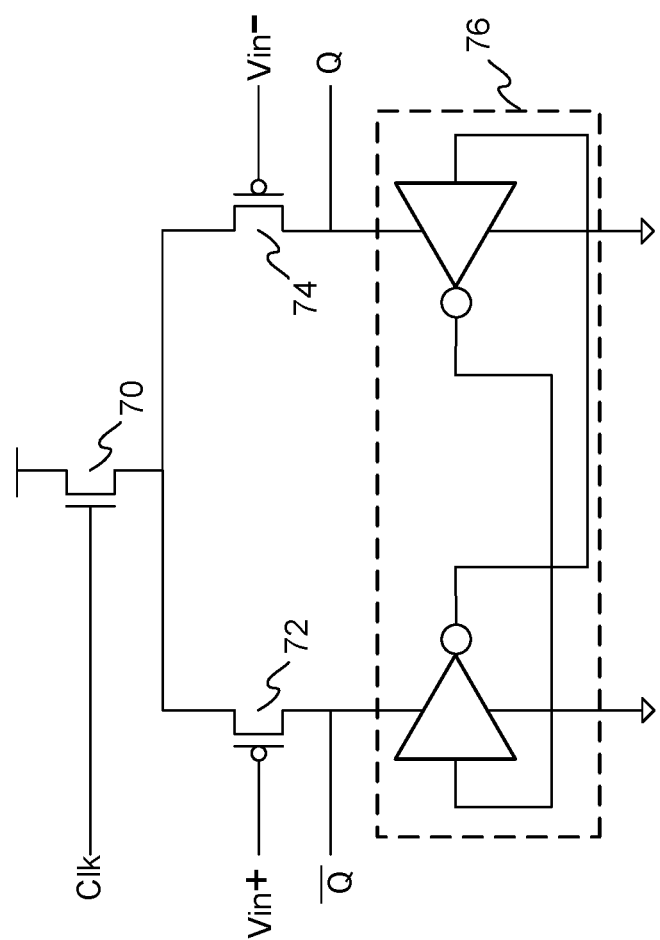
FIG. 5 illustrates a P-type metal-oxide-semiconductor ("PMOS")-based comparator of a DVM of the present disclosure.

FIG. 5 illustrates a PMOS-based comparator of a DVM of the present disclosure. A PMOS-based comparator can be used for comparing a selected voltage and an upward ramping voltage. The PMOS-based comparator can comprise a storage element 76, PMOS transistors 72 and 74, and an NMOS transistor 70. The storage element 76 can comprise two cross-coupled inverters. The transistor 72 and the storage element 76 can be coupled together at an inverse output $\overline{Q}$. The transistor 74 and the storage element 76 can be coupled together at an output Q. The transistor 70 is coupled across a high voltage and a connection with the transistors 72 and 74. The gate of the transistor 72 can be an input Vin+ for the comparator. The gate of the transistor 74 can be an input Vin− for the comparator. The gate of the transistor 70 can be coupled to a clock signal CLK.

It is appreciated that other comparator designs can be used in conjunction with the present disclosure. The present figure is only meant to aid in the understanding of the present disclosure and is not meant to limit the present disclosure in any manner.

Figure 6:
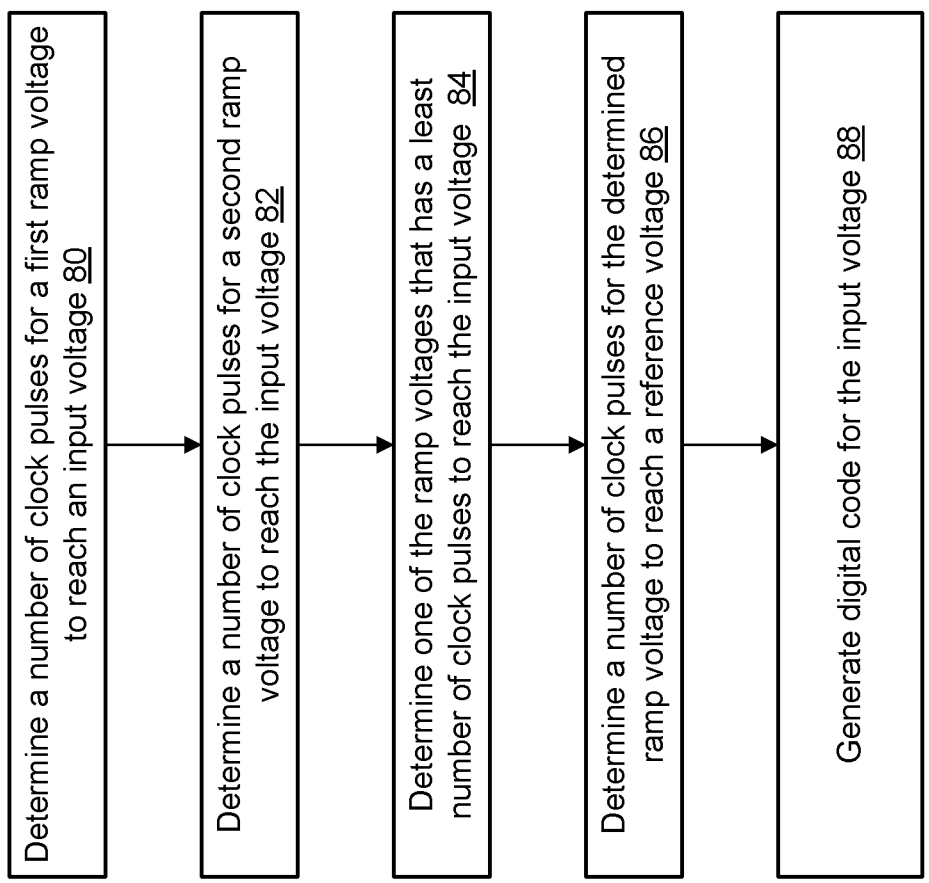
FIG. 6 illustrates a flow chart for operating a DVM of the present disclosure.

FIG. 6 illustrates a flow chart for operating a DVM of the present disclosure. A method for operating a DVM of the present disclosure can comprise the following: determining a number of clock pulses for a first ramp voltage to reach an input voltage 80; determining a number of clock pulses for a second ramp voltage to reach the input voltage 82; determining one of the first and the second ramp voltages having a least number of clock pulses to reach the input voltage 84; determining a number of clock pulses for the determined one of the first and the second ramp voltages to reach a reference voltage 86; and generating a digital code for the input voltage based on the determined number of clock pulses for the determined number of clock pulses to reach the reference voltage and for the determined least number of clock pulses to reach the input voltage 88.

In an embodiment, the reference voltage can be a fractional amount of the input voltage or of the rail voltage VDD. In another embodiment, the reference voltage can be equal to or a multiple amount of the input voltage or of the rail voltage VDD. In yet another embodiment, the first ramp voltage can be an upward ramping voltage signal starting from ground and the second ramp voltage can be a downward ramping voltage signal starting from a high voltage. Alternatively, the first ramp voltage can be a downward ramping voltage signal starting from a high voltage and the second ramp voltage can be an upward ramping voltage signal starting from ground. The order of the first two determining steps 80 and 82 can be interchangeable or performed simultaneously depending on the design of the DVM.

Figure 7:
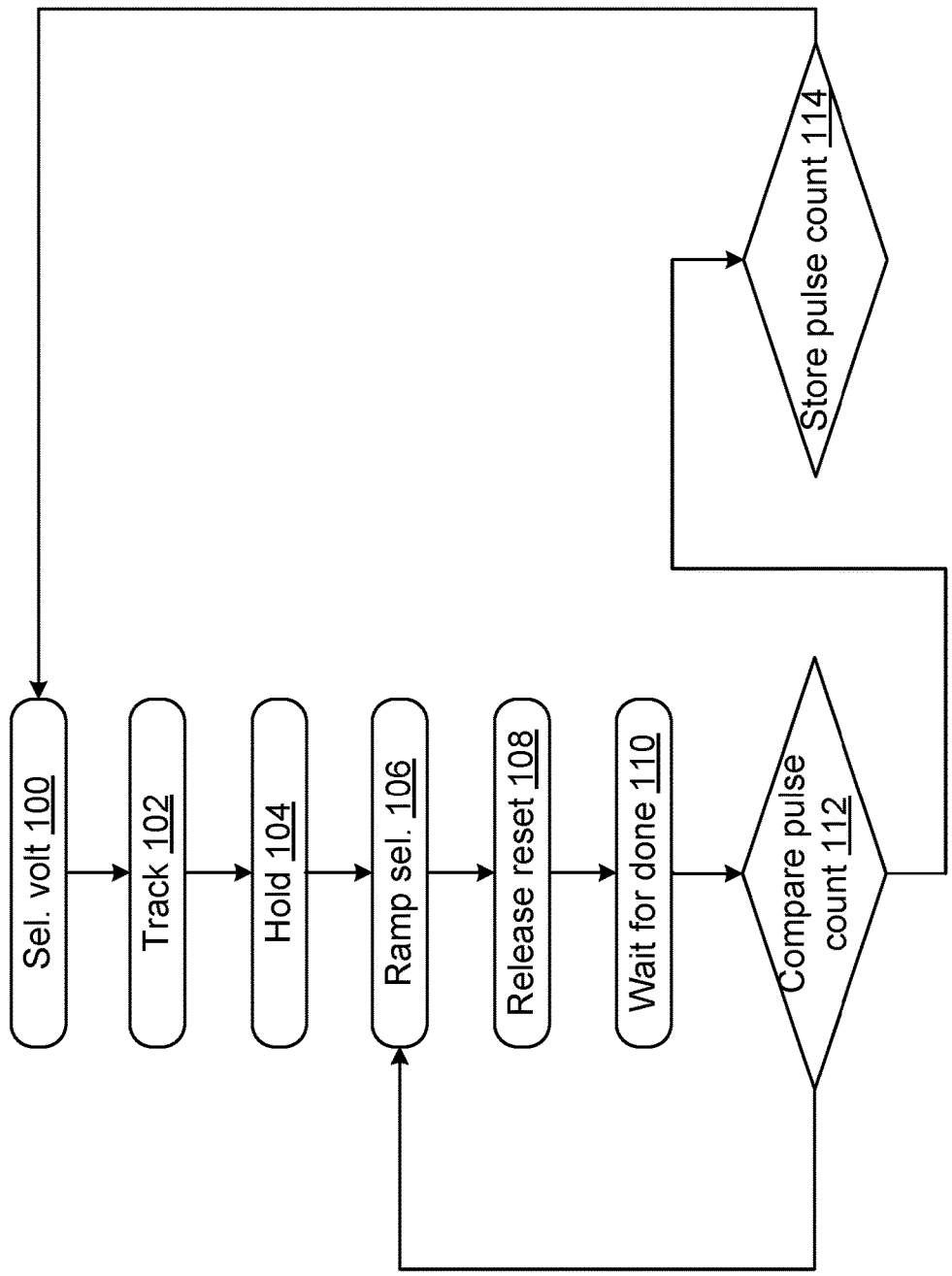
FIG. 7 illustrates another flow chart for operating a DVM of the present disclosure.

FIG. 7 illustrates another flow chart for operating a DVM of the present disclosure. A digital core of a DVM can trigger when a configuration input is asserted to start the DVM. To calculate a pulse count for an analog voltage, an analog voltage is selected and connected 100. The selected analog voltage is tracked 102 for a predefined number (e.g., 5, 20, or more) of cycles to get a stable charge at a sampling node. Next, the stable charged is held 104. The ramp direction is selected, e.g., upward from ground or downward from a high voltage. A reset is released 108 to start counting clocks pulses. A done signal Dout from a comparator when the ramping voltage reaches the selected voltage is waited for 110.

Once the done signal is generated, the pulse count is stopped and the number of pulses counted is stored. In comparing pulse counts 112, it is determined if a pulse count has been determined for each of the ramp directions. If so, the least amount of pulse counts and the corresponding ramp direction for that least amount are stored 114. If not, the current pulse count is saved for the first ramp direction, a reset flag is initialized to reset the storage capacitor, and the next ramp direction is selected 106 for determining the number of pulse counts for the next ramp direction. Once two pulse counts are stored in step 112, the smaller pulse count value is considered as a digital voltage representation of the selected analog signal.

With the least number of pulse counts and the corresponding ramp direction, that corresponding ramp direction can be used to calculate a pulse count for a reference voltage starting at selecting the analog reference voltage 100.

Additionally, the digital core can also provide a time-out feature that issues a done signal before a counter overflow occurs. A timeout can be needed because input signals close to VDD or ground may not be reached by one of two ramping voltages.

Figure 8:
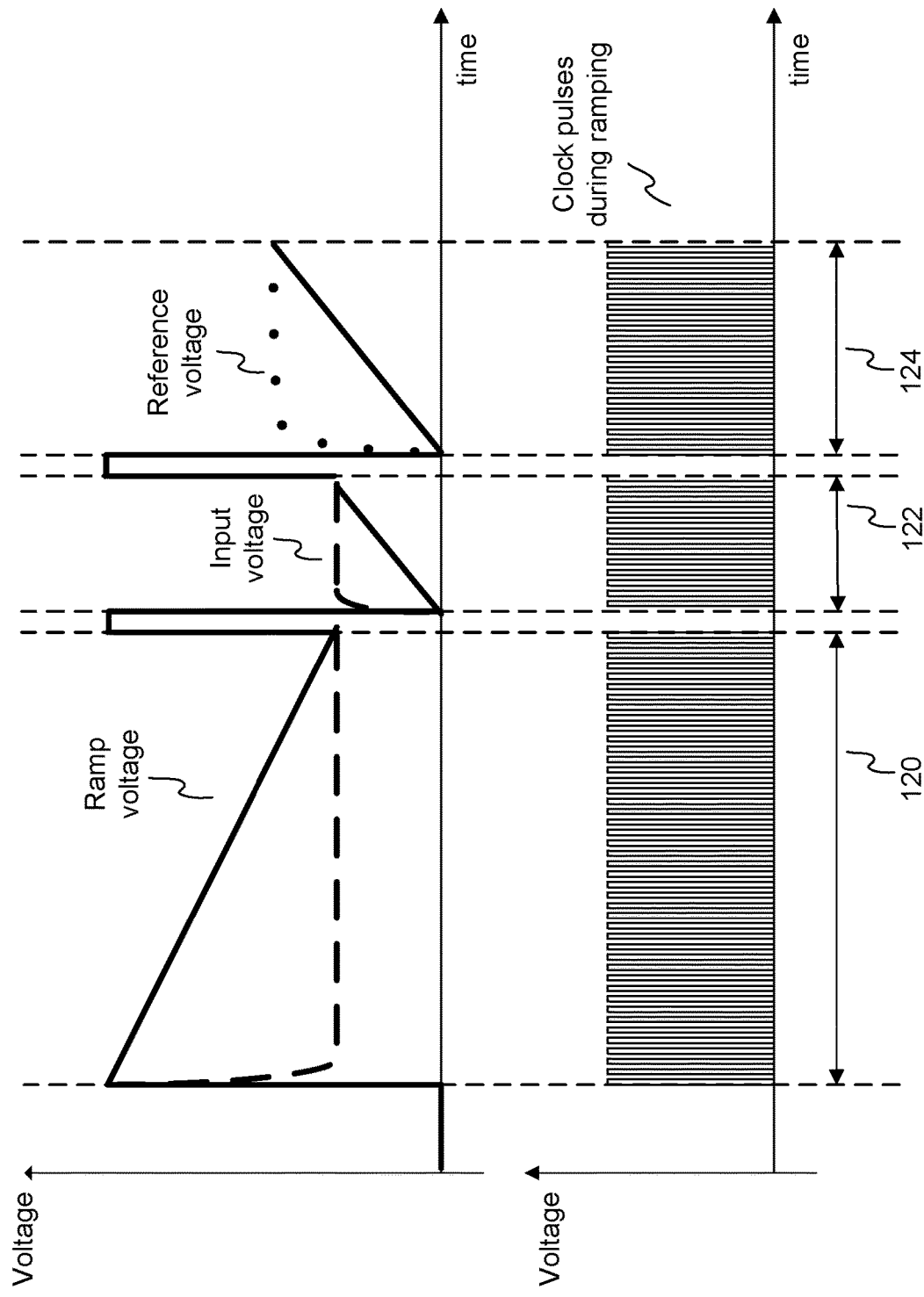
FIG. 8 illustrates a graph of various voltages for an example of operating a DVM of the present disclosure.

FIG. 8 illustrates a graph of various voltages for an example of operating a DVM of the present disclosure. In an example for determining the least number of pulse counts for an input voltage and a ramp direction for use for a reference voltage, a downward ramp voltage is generated until the ramp voltage reaches an input voltage, see area 120. Also shown in area 120, clock pulses are illustrated during this time which can be counted to determine a number of clock pulses during the downward ramping. This number of clock pulses during the downward ramping can be cached for further comparison.

Once the pulse count is finished for the downward ramping voltage, an upward ramp voltage can be generated until the ramp voltage reaches the input voltage, see area 122. Clock pulses during this time can be counted to determine a number of clock pulses during the upward ramping. This number of clock pulses during the upward ramping can be compared with the number of clock pulses counted during the downward ramping to determine which ramp direction provides for a shorter amount of time to reach the input voltage.

Once the ramp direction giving the smallest number of pulse counts is known, this information can be stored and used for determining a pulse count for a reference voltage. In this case, the upward ramp direction provides for the least number of pulses, i.e., the smallest pulse count. Thus, an upward ramp can be used to determine a pulse count for the reference voltage. The pulse count ends when the upward ramping voltage reaches the reference voltage, see area 124. Also in area 124, clock pulses can be counted during this duration to give the pulse count for the reference voltage. Once the pulse count is determined, this value can be stored and used for correlating the analog reference voltage to a digital code.

It is important to note that a forced timeout for stopping the pulse count be initiated if after a predefined amount of time has passed without the ramp voltage reaching the targeted voltage, i.e., the input voltage or the reference voltage. If there is a force time out during one of the first two ramping voltage directions for the input voltage, the ramping voltage that did not cause a force timeout is used for comparing to the reference voltage. If there is a forced timeout during ramping of a ramp voltage to the reference voltage, the opposite ramp direction can be used for determining a pulse count for the reference voltage.

Figure 9:
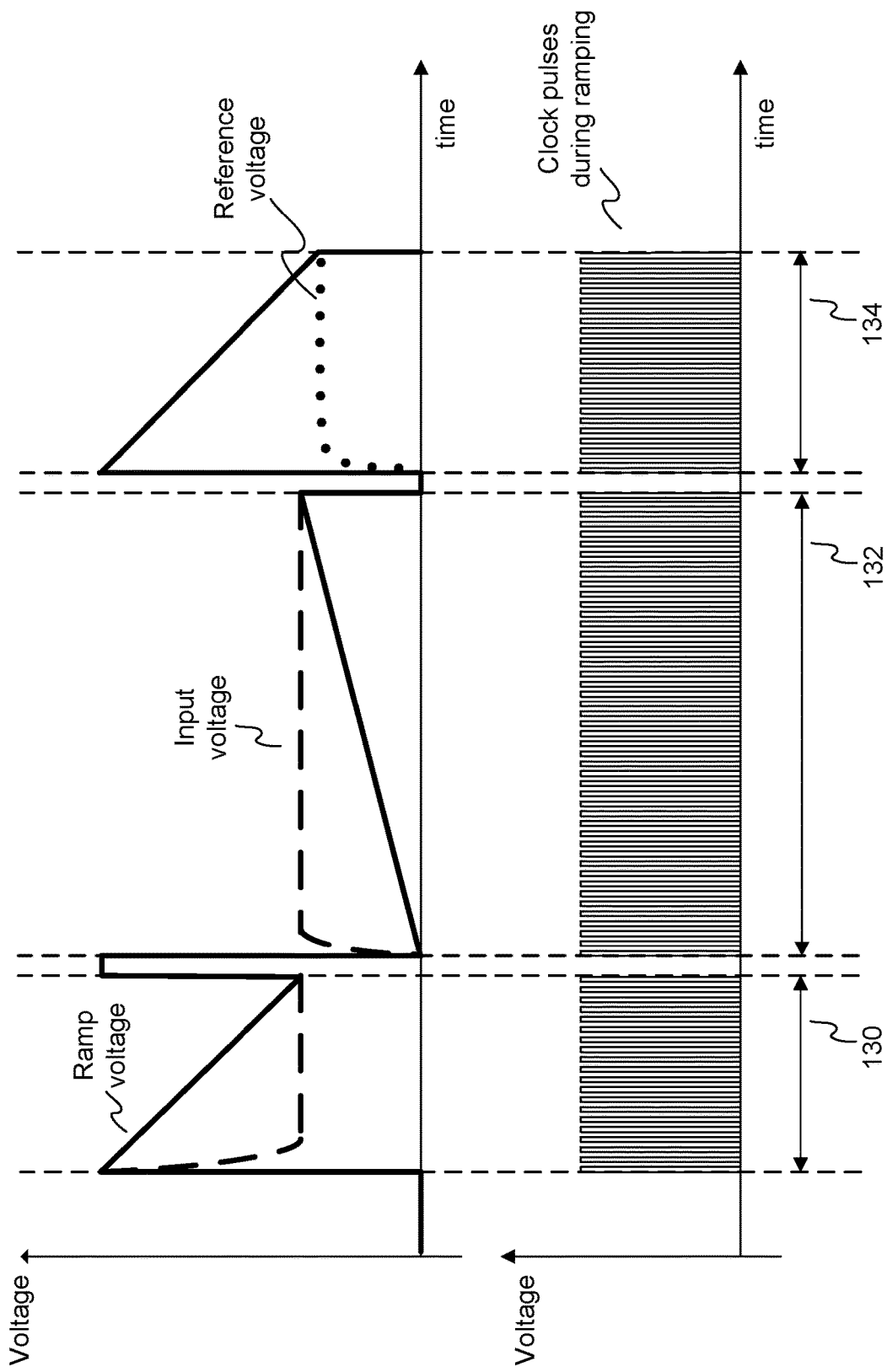
FIG. 9 illustrates a graph of various voltages for another example of operating a DVM of the present disclosure.

FIG. 9 illustrates a graph of various voltages for another example of operating a DVM of the present disclosure. In another example for determining the least number of pulse counts for an input voltage and a ramp direction for use for a reference voltage, a downward ramp voltage is generated until the ramp voltage reaches an input voltage, see area 130. Also in area 130, clock pulses are illustrated during this time, which can be counted to determine a number of clock pulses during the downward ramping. This number of clock pulses during the downward ramping can be cached for further comparison.

Once the pulse count is finished for the downward ramping voltage to the input voltage, an upward ramp voltage is generated until the ramp voltage reaches the input voltage, see area 132. Clock pulses during this time can be counted to determine a number of clock pulses during the upward ramping. This number of clock pulses during the upward ramping can be compared with the number of clock pulses determined during downward ramping to determine which ramp direction provides for a shorter amount of time to reach the input voltage.

Once the ramp direction giving the smallest number of pulse counts is known, this information can be stored and used for determining a pulse count for a reference voltage. In this case, the downward ramp direction provides for the least number of pulses, i.e., the smallest pulse count. Thus, a downward ramping voltage can be used to determine a pulse count for the reference voltage. The pulse count ends when the downward ramping voltage reaches the reference voltage, see area 134. Also in area 134, clock pulses can be counted during this duration to give the pulse count for the reference voltage. Once the pulse count is determined, this value can be stored and used for correlating the analog reference voltage to a digital code.

It is important to note that a forced timeout for stopping the pulse count be initiated if after a predefined amount of time has passed without the ramp voltage reaching the targeted voltage, i.e., the input voltage or the reference voltage. If there is a forced timeout during one of the first two ramping voltage directions for the input voltage, the ramping voltage that did not cause a force timeout is used for comparing to the reference voltage. If there is a forced timeout during ramping of a ramp voltage to the reference voltage, the opposite ramp direction can be used for determining a pulse count for the reference voltage.

It is appreciated that based on present disclosure it is understood that resolution of a DVM/ADC of the present disclosure can be increased by adding resolution to the reference digital-to-analog converter ("DAC"). For instance, if a reference voltage Vref is 4-bits, then the resolution of an entire system can be the sum of those bits of the DVM/ADC and DAC: 4+8=12 bits. Furthermore, dcore digital signal processing ("DSP") post-processing can be used to further increase the accuracy and speed of the DVM by providing one or more of the following: (1) correcting an initial-step offset error via subtraction; (2) correcting a non-linear curvature using calibration; and (3) caching of ramp direction for subsequent input, which can eliminate the subsequent input ramp if the pulse count decreases.

While the present disclosure has been described with reference to certain preferred embodiments or methods, it is to be understood that the present disclosure is not limited to such specific embodiments or methods. Rather, it is the inventors' contention that the disclosure be understood and construed in its broadest meaning as reflected by the following claims. Thus, these claims are to be understood as incorporating not only the preferred apparatuses, methods, and systems described herein, but all those other and further alterations and modifications as would be apparent to those of ordinary skilled in the art.

We claim:

1. A method for operating a digital voltmeter, comprising the steps of:
   determining a number of clock pulses for a first ramp voltage to reach an input voltage;
   determining a number of clock pulses for a second ramp voltage to reach the input voltage;
   determining one of the first and the second ramp voltages having a least number of clock pulses to reach the input voltage;
   determining a number of clock pulses for the determined one of the first and the second ramp voltages to reach a reference voltage; and generating a digital code for the input voltage based on the determined number of clock pulses for reaching the reference voltage and the determined least number of clock pulses for reaching the input voltage.

2. The method of claim 1, wherein the reference voltage is a fractional amount of a rail voltage.

3. The method of claim 1, wherein the first ramp voltage is an upward ramping voltage signal starting from ground and wherein the second ramp voltage is a downward ramping voltage signal starting from a high voltage.

4. The method of claim 1, wherein the first ramp voltage is a downward ramping voltage signal starting from a high voltage and the second ramp voltage is an upward ramping voltage signal starting from ground.

5. A digital voltmeter comprising:
a multiplexer for selecting between an input voltage and a reference voltage;
a down-ramp generator for generating a downward ramping voltage signal;
an up-ramp generator for generating an upward ramping voltage signal;
a track and hold circuit for providing a selected voltage from the multiplexer to the down-ramp generator and the up-ramp generator;
a first comparator;
a second comparator; and
a digital core,
wherein an output of the multiplexer is coupled to an input of the track and hold circuit,
wherein an output of the down-ramp generator and an output of the track and hold circuit are coupled to inputs of the down-ramp comparator,
wherein an output of the up-ramp generator and the output of the track and hold circuit are coupled to inputs of the up-ramp comparator,
wherein an output of the first comparator indicates when the downward ramping voltages signal reaches the selected voltage,
wherein an output of the second comparator indicates when the upward ramping voltage signal reaches the selected voltage, and
wherein the digital core is configured to control the down-ramp generator, the up-ramp generator, the multiplexer, the track and hold circuit, and the first and second comparators.

6. The digital voltmeter of claim 5, wherein the down-ramp generator and the up-ramp generator are current sources.

7. The digital voltmeter of claim 5, wherein the first comparator is an NMOS-based comparator.

8. The digital voltmeter of claim 5, wherein the second comparator is a PMOS-based comparator.

9. The digital voltmeter of claim 5, wherein the track and hold circuit comprises a storage capacitor and a switch.

10. The digital voltmeter of claim 5, wherein the digital core is off-chip, and further comprising input/output pins for connecting the off-chip digital core with the down-ramp generator, the up-ramp generator, the multiplexer, for receiving the input voltage and the reference voltage, for outputting outputs of down-ramp generator and the up-ramp generator.

11. The digital voltmeter of claim 5, wherein the digital core comprises a counter for counting clock pulses based on the outputs of the down-ramp generator and the up-ramp generator, non-transitory logic for operating the down-ramp generator, the up-ramp generator, and the multiplexer, and registers for storing one or more numbers of counted clock pulses.

12. The digital voltmeter of claim 11, wherein the logic is coupled to control inputs of the down-ramp generator, the up-ramp generator, and the multiplexer, wherein the input voltage and the reference voltage are coupled to inputs of the multiplexer, and wherein the outputs of the down-ramp generator and the up-ramp generator are coupled to the digital core.

13. A built-in self-test ("BIST") device of an integrated circuit ("IC"), comprising:
a digital voltmeter, and
a matrix for coupling one or more nodes of the IC to be sensed by the digital voltmeter for testing,
wherein the digital voltmeter comprises:
a multiplexer for selecting between an input voltage and a reference voltage;
a down-ramp generator for generating a downward ramping voltage signal;
an up-ramp generator for generating an upward ramping voltage signal;
a track and hold circuit for providing a selected voltage from the multiplexer to the down-ramp generator and the up-ramp generator;
a first comparator;
a second comparator; and
a digital core,
wherein an output of the multiplexer is coupled to an input of the track and hold circuit,
wherein an output of the down-ramp generator and an output of the track and hold circuit are coupled to inputs of the down-ramp comparator,
wherein an output of the up-ramp generator and the output of the track and hold circuit are coupled to inputs of the up-ramp comparator,
wherein an output of the first comparator indicates when the downward ramping voltage signal reaches the selected voltage,
wherein an output of the second comparator indicates when the upward ramping voltage signal reaches the selected voltage, and
wherein the digital core is configured to control the down-ramp generator, the up-ramp generator, the multiplexer, the track and hold circuit, and the first and second comparators.

14. The BIST device of claim 13, wherein the down-ramp generator and the up-ramp generator are current sources.

15. The BIST device of claim 13, wherein the first comparator is an NMOS-based comparator.

16. The BIST device of claim 13, wherein the second comparator is a PMOS-based comparator.

17. The BIST device of claim 13, wherein the track and hold circuit comprises a storage capacitor and a switch.

18. The BIST device of claim 13, wherein the digital core is off-chip, and further comprising input/output pins for connecting the off-chip core with the down-ramp generator, the up-ramp generator, the multiplexor, for receiving the input voltage the reference voltage, for outputting outputs of down-ramp generator and the up-ramp generator.

19. A BIST device of claim 13, wherein the digital core comprises a counter for counting clock pulses based on the outputs of the down-ramp generator and the up-ramp generator, non-transitory logic for operating the down-ramp generator, the up-ramp generator, and the multiplexer, and registers for storing one or more numbers of counted clock pulses.

20. The BIST device of claim 19, wherein the logic is coupled to control inputs of the down-ramp generator, the up-ramp generator, and the multiplexer, wherein the input voltage and the reference voltage are coupled to inputs of the multiplexer, and wherein the outputs of the down-ramp generator and the up-ramp generator are coupled to the digital core.

* * * * *